United States Patent [19]

Ono et al.

[11] 3,860,948

[45] *Jan. 14, 1975

[54] METHOD FOR MANUFACTURING SEMICONDUCTOR DEVICES HAVING OXIDE FILMS AND THE SEMICONDUCTOR DEVICES MANUFACTURED THEREBY

[75] Inventors: Minoru Ono; Toshimitsu Momoi; Youji Kawachi, all of Tokyo, Japan

[73] Assignee: Hitachi, Ltd., Tokyo, Japan

[ * ] Notice: The portion of the term of this patent subsequent to Feb. 24, 1987, has been disclaimed.

[22] Filed: Nov. 8, 1972

[21] Appl. No.: 304,668

Related U.S. Application Data

[62] Division of Ser. No. 71,810, Sept. 14, 1970, , which is a division of Ser. No. 431,677, Feb. 10, 1965, Pat. No. 3,643,137.

[30] Foreign Application Priority Data

Feb. 13, 1964 Japan .................................. 39-7388

[52] U.S. Cl. ........................ 357/60, 357/23, 357/34, 357/52

[51] Int. Cl. ............................................. H01l 3/12

[58] Field of Search ... 317/235 AS, 235 E, 235 AG, 317/235 B

[56] References Cited

UNITED STATES PATENTS

| | | | |
|---|---|---|---|
| 3,226,612 | 12/1965 | Haenichen | 317/235 B |
| 3,265,905 | 8/1966 | McNeil | 317/235 E |
| 3,302,078 | 1/1967 | Skellett | 317/235 AS |
| 3,451,866 | 6/1969 | Mutter | 317/235 AG |
| 3,472,703 | 10/1969 | Ono et al. | 317/235 AG |
| 3,497,775 | 2/1970 | Ono et al. | 317/235 |
| 3,585,464 | 6/1971 | Castrucci et al. | 317/235 AS |
| 3,643,137 | 2/1972 | Ono et al. | 317/235 AS |

FOREIGN PATENTS OR APPLICATIONS

| | | |
|---|---|---|
| 923,153 | 4/1963 | Great Britain |

OTHER PUBLICATIONS

B. Deal, "Oxidation of Silicon," J. Electro-Chem. Soc., June 1963, Vol. 110, No. 6, pp. 527–533.

Balk et al., Proc IEEE, "Orientation Dependence," Dec. 1965, pp. 2133–2134.

*Primary Examiner*—Rudolph V. Rolinec
*Assistant Examiner*—William D. Larkins
*Attorney, Agent, or Firm*—Ernest F. Marmorek

[57] ABSTRACT

A silicon crystal body having a major surface lying parallel to a {110} or {100} crystal plane is prepared. A silicon oxide film is formed on the major surface by heating the body in an atmosphere containing steam. Then, an aluminum layer is formed on the oxide film. Thereby the amount of surface donors induced in the major surface of the body by the existence of the oxide film is smaller than the amount of induced surface donors to be obtained in a crystal plane of a like silicon body but lying parallel to a {111} plane covered with a like oxide film. The amount of induced surface donors is further reduced by subjecting said body to a heat treatment under application across said oxide film of such a voltage as that which renders the aluminum layer provided on the oxide film negative polarity. This invention is applied to the manufacture of, for example, MOS field effect transistors, MOS diodes and so-called planar transistors.

8 Claims, 7 Drawing Figures

METHOD FOR MANUFACTURING SEMICONDUCTOR DEVICES HAVING OXIDE FILMS AND THE SEMICONDUCTOR DEVICES MANUFACTURED THEREBY

CROSS-REFERENCES

This is a division of co-pending application Ser. No. 71,810 filed on Sept. 14, 1970 which in turn is a division of earlier application Ser. No. 431,677 filed on Feb. 10, 1965 now U.S. Pat. No. 3,643,137, dated Feb. 15, 1971.

BACKGROUND OF THE INVENTION

This invention relates to a method for manufacturing a semiconductor device having an oxide film on the surface of a semiconductor body, and to the semiconductor device manufactured thereby.

In general, silicon crystal bodies having major surfaces lying parallel to a {111} crystal plane have been widely used in manufacturing semiconductor devices in which the major surfaces of the silicon bodies are covered with oxide films of insulator material which is moisture-resistant and is chemically stable such as, for example, of silicon dioxide $SiO_2$. A planar transistor in which diffused regions are formed in the major surface of the body lying parallel to a {111} crystal plane covered with a passivating film is an example of such semiconductor devices.

In the case where the above-mentioned silicon dioxide film is formed on the surface of a semiconductor substrate, a donor-type surface charge appears in the surface of the semiconductor substrate immediately below the silicon dioxide film, irrespective of the conductivity type of the substrate. This phenomenon is sometimes called as the channel effect. Accordingly, it has been proposed to produce field effect transistors by utilizing the channel effect.

A large amount of the donor-type induced surface charge, however, usually gives disadvantages to semiconductor devices, such as planar transistors and MOS field effect transistors. For example, the N-type channel or inversion layer appeared in a surface of a P-type silicon substrate due to the induced surface charge gives rise to adverse results such as increase in the collector cut-off current $I_{co}$ of the planar transistor. Further, due to the large amount of the induced surface charge, an MOS field effect transistor having a high mutual conductance $g_m$ can hardly be obtained. Furthermore, the large amount of the donor-type surface charge within the channel layer means that in a field effect transistor the drain current at the time of zero gate voltage has a certain large value.

For reducing the amount of the induced surface charge, a heat treatment combined with application of voltage across the oxide film can be applied to such semiconductor devices. However, even by this heat treatment, there has been a limit to the amount of controllable surface charge, that is, a limit below which the amount of the donor-type surface charge cannot be reduced.

SUMMARY OF THE INVENTION

It is therefore an object of this invention to provide semiconductor devices in which the amount of the donor-type surface charge induced in the semiconductor surfaces by the existence of the oxide films is desirably reduced, and to provide the method for manufacturing the same.

It is another object of this invention to provide a method for producing a planar transistor having a low value of the collector cut-off current $I_{co}$.

It is a further object of this invention to provide a method for manufacturing an MOS field effect transistor having the high value of the mutual conductance.

It is a still further object of this invention to provide a method for manufacturing an MOS field effect transistor having high amplifying gain.

It is a still further object of this invention to provide a method for manufacturing an MOS field efffect transistor having the steep rising slopes of the current-voltage curves in the low drain voltage range, that is, for manufacturing an MOS field effect transistor of high sensitivity for small signals.

According to one embodiment of the present invention an MOS-type field effect transistor is manufactured by forming an oxide film such as of silicon oxide on the surface of a silicon semiconductor crystal body, which is oriented to a crystal plane lying substantially parallel to a {100} or {110} plane and forming a gate electrode covering the oxide film. The combination may be subjected to heat treatment in the state of application of a voltage between the semiconductor crystal body and the gate electrode on the oxide film.

The nature, principle, and details of the invention will be more clearly apparent from the following detailed description when read in conjunction with the accompanying drawings in which like parts are designated by like reference characters.

FIGS. *2a*, *2b* and *2c* are graphical representations indicating conductance vs. gate voltage characteristics of MOS field effect transistors manufactured according to the present invention and according to the prior art.

Figure 3:
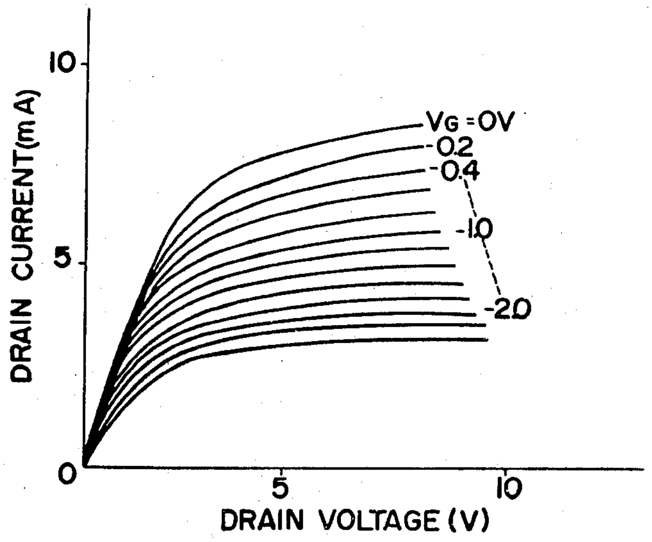
Figure 4:
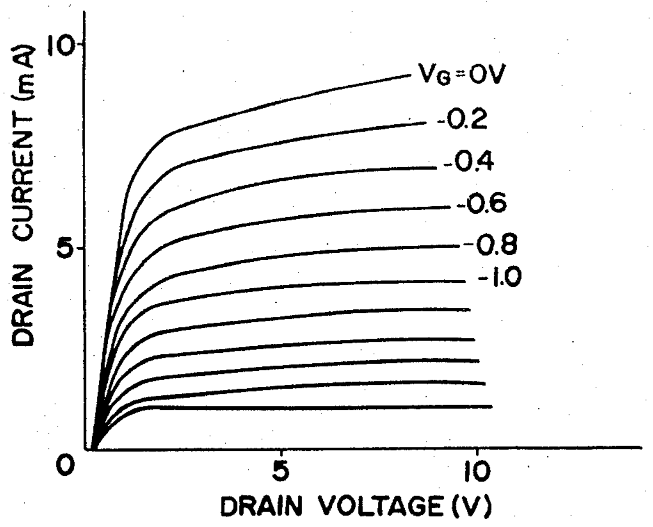

FIGS. 3 and 4 are graphical representations indicating the drain current vs. drain voltage characteristics of MOS field effect transistors manufactured in accordance with the prior art method any by the method according to the invention, respectively.

Figure 5:
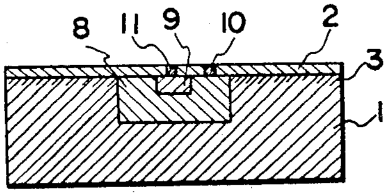

FIG. 5 is a sectional view of a planar transistor manufactured by the method according to this invention.

DESCRIPTION OF THE PREFERRED EMBODIMENTS

Figure 1:
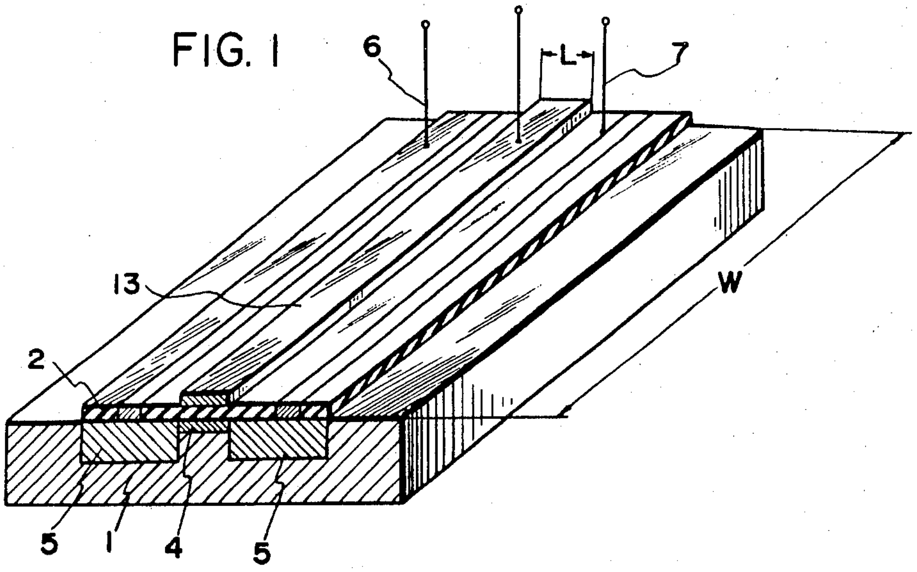
FIG. 1 is a perspective view including a part in section for a description of the principle of the invention.

The principle of the invention will be explained with reference to FIGS. 1 and *2a* to *2c*.

A plurality of MOS field effect transistors are manufactured by using three sorts of silicon crystalline semiconductor bodies having major surfaces lying parallel to a {100}, a {110} and a {111} plane, respectively. Each sample transistor has, as shown in FIG. 1, a P conductivity-type silicon crystalline substrate 1 of 100 ohm cm, a silicon dioxide film 2 approximately 1,500 A. thick grown on the substrate 1, and a gate electrode 13 of aluminum deposited on the film 2 by a conventional evaporation method. A channel layer 4 of a donor-type surface charge or of surface donors is induced in the surface of the semiconductor substrate 1. In addition, N-type regions 5 of 1,600 micron length and approximately 10 micron depth are formed with a spacing therebetween of 7 microns in the surface of the crystal substrate 1 and are provided respectively with a source electrode 6 and a drain electrode 7. The N-type regions 5 are formed for providing ohmic contacts to the channel 4.

Then, measurements of the electric characteristics such as the density $N_{DS}$ of surface donors and the conductance G are effected with the sample devices having such structures. The conductance G is measured between the terminals 6 and 7. This conductance may be, in general, expressed by the following equation.

$$G = (q \cdot N_{DS} - Q)\ \mu d \cdot (W/L) \tag{1}$$

where $q$ is the electric charge which an electron has;

$N_{DS}$ is the density of the induced surface donors;

$Q$ is the charge applied to electrode 13 by the outside biasing means; and $\mu d$ is the surface electron mobility.

When $Q = 0$, the above equation becomes $G = q \cdot N_{DS} \cdot \mu d \cdot (W/L)$, the conductance $G$ is proportional to the density $N_{DS}$ of the surface donors.

Where a voltage $V_G$ having such a voltage vlaue $V_{GO}$ as to induce the charge $$Q = q \cdot N_{DS} \tag{2}$$

is applied to the gate electrode 13, the conductance $G$ will become equal to zero. On the other hand, $$Q = V_{GO} \cdot C_G \tag{3}$$

where $C_G$ is the capacitance of the gate input.

From Equation (3), it is possible to determine the value of $Q$. Now considering the case of $Q = q \cdot N_{DS}$ and $Q = V_{GO} \cdot C_G$, the density $N_{DS}$ of the induced surface donors can be expressed by the following equation.

$$N_{DS} = V_{GO} \cdot C_G / q \tag{4}$$

Using the relation shown in the equation (4), the density of the induced surface donors can be calculated in accordance with the results obtained by measuring the applied gate voltage $V_{GO}$ and the capacitance $C_G$.

Before effecting measurements, each sample device is subjected to the above-mentioned heat treatment in order to decrease deviations in measured values among the same type of samples. A DC voltage of 5 volts is applied between the gate electrode 13 and electrode 6 (or the drain electrode 7) with the positive polarity applied to the source electrode 6 (or electrode 7). Then, as this voltage is applied, each sample transistor is heat-treated at 350° C for 2 hours, whereupon the density of induced surface donors in the channel layer 4 is decreased remarkably relative to that prior to treatment and reached a minimum density value of surface donors.

Figure 2A:
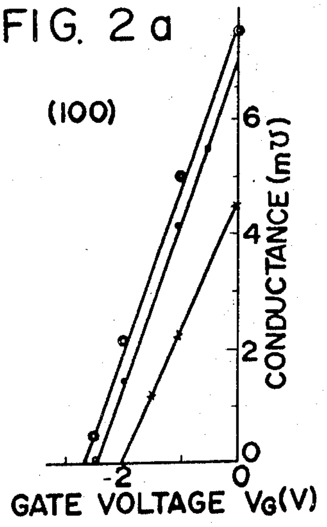
Figure 2B:
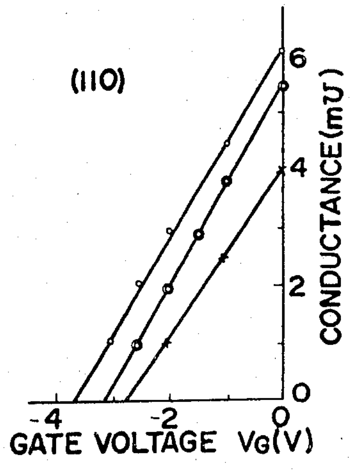
Figure 2C:
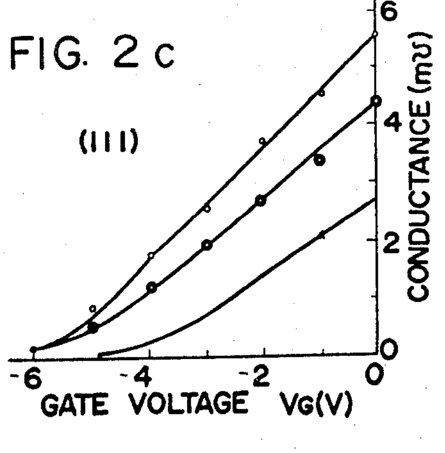

The relationship between the gate voltage $V_G$ ($V$) and the conductance $G$ ($m\omega$) measured between the source and the drain electrode of each sample field effect transistor after treatment in the above-described manner are graphically indicated in FIGS. 2a to 2c which show characteristic curves for transistors in which the {100}, {110}, and {111} crystal planes are used, respectively. The results, including the relationship in connection with surface electron mobility, may be represented as shown in the accompanying Table 1.

Table 1

| Crystal Orientation | $V_{GO}$ (volt) | $[N_{DS}]$ min | $\mu d$ ($cm^2$/V sec) |
|---|---|---|---|
| {111} | − 5.5 | 8.3 × $10^{11}/cm^2$ | 150 |
| {110} | − 3.3 | 5.0 × $10^{11}/cm^2$ | 320 |
| {100} | − 2.3 | 3.5 × $10^{11}/cm^2$ | 530 |

As is apparent from Table 1 the values of gate voltage $V_{GO}$ corresponding to the case of $G = 0$ become smaller in the order of {111}, {110}, and {100} planes. Since this voltage $V_{GO}$ is proportional to the density $N_{DS}$ of surface donors as can be observed from Equation (4), a small value of $V_{GO}$ means a small value of $N_{DS}$. Therefore, it is apparent that the density $N_{DS}$ of surface donors in the channel layers 4 becomes smaller in the order of the above-mentioned three kinds of crystal planes.

Furthermore, a high electron mobility $\mu$d means a large conductance variation with respect to gate voltage variation, that is, a high sensitivity of voltage. The high value of election mobility is advantageous particularly for MOS-type field effect transistors.

The present invention, which is based on the above considerations, is principally characterized in that a silicon crystalline substrate having a major surface lying parallel to a crystal plane other than a {111} plane, particularly to a {100} or a {110} crystal plane, is prepared and that an oxide film is formed on the major surface, the {111} plane having been widely used in the art.

In order to indicate more fully the nature of the invention, the following typical examples are set forth. It should be understood, however, that these examples are presented as illustrative only, and that it is not intended to limit the scope of the invention.

A silicon crystalline substrate 1 of P type 4 ohm cm resistivity having a major surface lying parallel to a {100} plane is prepared. The crystalline substrate 1 is heat-treated for 20 minutes in an oxidizing atmosphere containing steam at approximately 1,000° C to form thereon a silicon dioxide film 2 of approximately 1,500 A. thickness as shown in FIG. 1. As a result, a channel layer 4 of donor-type surface charge may be induced immediately below the silicon dioxide film 2. Aluminum is deposited by a conventional evaporation method on the silicon dioxide film 2 to form a gate electrode 13 having the length L of 5 microns and the width W of 1,600 microns as shown in FIG. 1. In addition, N-type regions 5 of 1,600 micron length, 10 micron depth, and a resistivity of approximately 0.5 ohm cm are formed in the substrate 1 as shown with a spacing of 7 microns therebetween by a conventional selective diffusion method, and a source electrode 6 and a drain electrode 7 are connected thereto, respectively.

In order to obtain a better result, the field effect transistor may be subjected to the above-mentioned heat treatment so as to reduce the density of surface donors. That is, a DC voltage of 5 volts is applied between the source electrode 6 (or drain electrode 7) and the gate electrode 13 of the transistor fabricated by the above-described processes, the voltage being applied with positive polarity to the electrode 6 (or 7). Then, as the voltage is so applied, the transistor is heat-treated at a temperature of 350° C for a period of time of 1 hour or longer which is sufficient to decrease the density of surface donors in the channel layer 4 to a minimum value.

The impressed DC voltage, the heating temperature, and the period of time for heat treatment set forth above are merely illustrative, and a shorter period of time for heat treatment suffices when the impressed DC voltage is raised. The heating temperature should be at least 75° C in the case of a silicon substrate. Otherwise, the density of surface donors cannot be reduced to the minimum value. The only requirement is that the combination of the above mentioned three factors of this treatment be such that the density of surface donors in the channel layer 4 is decreased.

The density $N_{DS}$ of surface donors induced in the major surface lying parallel to the {100} plane of the MOS field effect transistor according to this invention is $2 \times 10^{11}/cm^2$. In contrast, the density of surface donors in a major surface lying parallel to a {111} plane of a like conventional MOS field effect transistor fabricated by a like method is $5 \times 10^{11}/cm^2$. Thus, the value of the density of surface donors in the transistor according to the present invention is 0.4 time of that of a conventional device.

Drain current vs. drain voltage characteristics of MOS type field effect transistors fabricated by the prior art method and by the method according to the present invention are shown in FIGS. 3 and 4, respectively. The spaces between the curves for different gate voltage $V_G$ become much wider in FIG. 4, which shows characteristics for the transistor according to this invention, than in FIG. 3 for a conventioned transistor. This indicates that the mutual conductance $g_m$ in the device of the instant invention is higher than that of the known device, whereby a device of high gain can be obtained.

Furthermore, the rising slopes of the current-voltage curves in the low drain voltage range are steeper than those of the known device, whereby it is evident that a device of high sensitivity can be obtained.

Another embodiment will be explained with reference to FIG. 5. A P-type silicon crystalline substrate 1 having a major surface lying substantially parallel to a {100} or a {110} plane is prepared. An N-type base region 8 and a P-type emitter region 9 are formed in the major surface of the substrate 1 by conventional selective diffusion method. The major surface of the substrate 1 is covered with a silicon oxide film 2. Then, electrodes 10 and 11 are connected to the base and the emitter region through holes formed in the oxide film 2, respectively.

In the transistor, the density $N_{DS}$ of surface donors of an N-type inversion layer 3 induced in and spreading over the major surface of the semiconductor 1 immediately below the film 2 is made much smaller than that in a like PNP-type planar transistor but having major surface of the semiconductor substrate lying parallel to a {111} plane. Accordingly, the value of the collector cut-off current $I_{co}$ can be substantially decreased, and a planar transistor having highly desirable characteristics can be obtained.

It will also be obvious that the present invention can be applied to MOS type diodes.

It should be understood, therefore, that the foregoing disclosure relates to only an illustrative embodiment of the invention and that it is intended to cover all changes and modifications of the example of the invention herein chosen for the purposes of the disclosure, which do not constitute departures from the spirit and scope of the invention.

We claim:

1. A semiconductor device comprising:

a silicon crystalline body of a given conductivity type having a substantially plane major surface lying substantially parallel to a {100} crystal plane;

a silicon oxide film covering said major surface and having a tendency to induce surface donors in said major surface of said body contiguous therewith, the surface density of surface donors induced in said major surface of said body by the existence of said film being not more than $3.5 \times 10^{11}$ electrons/cm$^2$; and electrode means operatively connected to the combination of said silicon crystal body and said oxide film.

2. A semiconductor device comprising:

a silicon crystalline body of a given conductivity type having a substantially plane major surface lying substantially parallel to a {110} crystal plane;

a silicon oxide film covering said major surface and having a tendency to induce surface donors in said major surface of said body contiguous therewith, the surface density of surface donors induced in said major surface of said body by the existence of said film being not more than $5 \times 10^{11}$ electrons/cm$^2$.

3. A field effect type semiconductor device comprising:

a silicon single crystalline substrate of a first conductivity type; having a substantially plane major surface lying substantially parallel to a {100} crystal plane;

a source and a drain region of a second conductivity type opposite to said first conductivity type formed in said major surface;

a silicon oxide film covering said major surface including the substrate surface lying between said source and drain regions and having a tendency to induce surface donors in said major surface of said body thereunder, the surface density of surface donors induced in said substrate surface lying between said source and drain regions by the existence of said film being not more than $3.5 \times 10^{11}$ electrons/cm$^2$; and a gate electrode covering said film covering said major surface of said substrate between said source and drain regions.

4. A planar type semiconductor device comprising:

a monocrystalline silicon body having a substantially plane major surface lying substantially parallel to a {100} crystal plane and including a first region of a first conductivity type extending to said major surface, a second region of a second conductivity type opposite to said first conductivity type formed in said major surface and forming with said first region a first PN junction extending to said surface and defining a first enclosure of the second region, a third region of said first conductivity type formed in said major surface and in said second region and forming with said second region a second PN junction extending to said major surface and defining a second enclosure of said third region in said first enclosure;

an oxide film covering said major surface of said substrate and having a tendency to induce surface donors in said major surface of said body thereunder, the surface density of surface donors induced in said major surface being not more than $3.5 \times 10^{11}$ electrons/cm$^2$; and electrode means connected to said second and third regions.

5. A semiconductor device comprising:

a silicon crystal body of a given conductivity type having a substantially plane major surface lying substantially parallel to a {100} crystal plane;

an insulating film consisting essentially of silicon oxide covering said major surface and having a tendency to induce surface donors in said major surface of said body contiguous therewith; the surface density of induced surface donors being not more than $3.5 \times 10^{11}$ electrons/cm$^2$; and electrode means operatively connected to the combination of said silicon crystal body and said insulating film.

6. A field effect type semiconductor device comprising:

a silicon single crystalline substrate of a first conductivity type having a substantially plane major surface lying substantially parallel to a {100} crystal plane;

a pair of source and drain regions of a second conductivity type opposite to said first conductivity type disposed in said major surface;

an insulating film consisting essentially of silicon oxide covering at least a portion of said major surface between said source and drain regions; and a gate electrode formed on said insulating film covering said portion of said major surface between said source and drain regions;

the density of surface charge induced in the surface of the substrate by the existence of said insulating film being not more than $3.5 \times 10^{11}$ electrons/cm$^2$.

7. A planar type semiconductor device comprising:

a monocrystalline silicon body having a substantially plane major surface lying substantially parallel with a {100} crystal plane and including a first region of a first conductivity type extending to said major surface, a second region of a second conductivity type opposite to said first conductivity type formed in said major surface and forming with said first region a first PN junction extending to said surface and defining a first enclosure of the second region, a third region of said first conductivity type formed in said major surface and in said second region and forming with said second region a second PN junction extending to said major surface and defining a second enclosure of said third region in said first enclosure;

an insulating film consisting essentially of silicon oxide covering said major surface of said substrate; and electrode means connected to said second and third regions;

the density of surface charge induced in the surface of the substrate by the existence of said insulating film being not more than $3.5 \times 10^{11}$ electrons/cm$^2$.

8. A circuit element structure comprising:

a body of monocrystalline silicon material having a surface crystallographic orientation substantially parallel to a {100} plane;

a plurality of PN junctions formed in said body;

said body having a silcon dioxide layer over its surface, and covering and passivating said junctions;

said PN junctions forming at least a portion of a semiconductor element formed in said structure;

the density of interface states at the silicon dioxide to silicon interface between said body and said layer being less than approximately $3.5 \times 10^{11}$ per cm$^2$.

* * * * *